(12) United States Patent
Rao

(10) Patent No.: US 7,781,827 B2
(45) Date of Patent: Aug. 24, 2010

(54) SEMICONDUCTOR DEVICE WITH A VERTICAL MOSFET INCLUDING A SUPERLATTICE AND RELATED METHODS

(75) Inventor: Kalipatnam Vivek Rao, Grafton, MA (US)

(73) Assignee: Mears Technologies, Inc., Waltham, MA (US)

( * ) Notice: Subject to any disclaimer, the term of this patent is extended or adjusted under 35 U.S.C. 154(b) by 394 days.

(21) Appl. No.: 12/018,260

(22) Filed: Jan. 23, 2008

(65) Prior Publication Data

US 2008/0179664 A1   Jul. 31, 2008

Related U.S. Application Data

(60) Provisional application No. 60/886,375, filed on Jan. 24, 2007.

(51) Int. Cl.
*H01L 21/336* (2006.01)
*H01L 29/76* (2006.01)
*H01L 29/80* (2006.01)

(52) U.S. Cl. ............... 257/329; 257/107; 257/369; 257/E21.41; 257/E29.056; 257/E29.075; 257/E29.262; 438/157; 438/197; 438/268; 438/285; 438/468; 438/481

(58) Field of Classification Search .......... 257/107, 257/329, 369, E21.41, E29.056, E29.075, 257/E29.262; 438/157, 197, 268, 285, 468, 438/481

See application file for complete search history.

(56) References Cited

U.S. PATENT DOCUMENTS

| 4,485,128 A | 11/1984 | Dalal et al. ............. 427/85 |
| 4,594,603 A | 6/1986 | Holonyak, Jr. ............. 357/16 |
| 4,882,609 A | 11/1989 | Schubert et al. ............. 357/22 |

(Continued)

FOREIGN PATENT DOCUMENTS

EP   0 843 361   5/1998

(Continued)

OTHER PUBLICATIONS

Luo et al., *Chemical Design of Direct-Gap Light-Emitting Silicon*, published Jul. 25, 2002, The American Physical Society; vol. 89, No. 7.

(Continued)

*Primary Examiner*—Dao H Nguyen
(74) *Attorney, Agent, or Firm*—Allen, Dyer, Doppelt, Milbrath & Gilchrist, P.A.

(57) ABSTRACT

A semiconductor device may include at least one vertical Metal Oxide Semiconductor Field Effect Transistor (MOSFET) on a substrate. The vertical MOSFET may include at least one superlattice including a plurality of laterally stacked groups of layers transverse to the substrate. The vertical MOSFET(s) may further include a gate laterally adjacent the superlattice, and regions vertically above and below the superlattice and cooperating with the gate for causing transport of charge carriers through the superlattice in the vertical direction. Each group of layers of the superlattice may include stacked base semiconductor monolayers defining a base semiconductor portion and at least one non-semiconductor monolayer constrained within a crystal lattice of adjacent base semiconductor portions. At least some atoms from opposing base semiconductor portions may be chemically bound together with the chemical bonds traversing the at least one intervening non-semiconductor monolayer.

26 Claims, 8 Drawing Sheets

U.S. PATENT DOCUMENTS

| | | | | |
|---|---|---|---|---|
| 4,908,678 | A | 3/1990 | Yamazaki | 357/4 |
| 4,937,204 | A | 6/1990 | Ishibashi et al. | 437/110 |
| 4,969,031 | A | 11/1990 | Kobayashi et al. | 357/63 |
| 5,055,887 | A | 10/1991 | Yamazaki | 357/4 |
| 5,081,513 | A | 1/1992 | Jackson et al. | 357/23.7 |
| 5,216,262 | A | 6/1993 | Tsu | 257/17 |
| 5,311,050 | A | 5/1994 | Nitayama et al. | 257/330 |
| 5,357,119 | A | 10/1994 | Wang et al. | 257/18 |
| 5,576,221 | A | 11/1996 | Takemura et al. | 437/2 |
| 5,577,061 | A | 11/1996 | Hasenberg et al. | 372/45 |
| 5,594,567 | A | 1/1997 | Akiyama et al. | 349/28 |
| 5,606,177 | A | 2/1997 | Wallace et al. | 257/25 |
| 5,616,515 | A | 4/1997 | Okuno | 438/478 |
| 5,627,386 | A | 5/1997 | Harvey et al. | 257/79 |
| 5,683,934 | A | 11/1997 | Candelaria | 437/134 |
| 5,684,817 | A | 11/1997 | Houdre et al. | 372/45 |
| 5,994,164 | A | 11/1999 | Fonash et al. | 438/97 |
| 6,058,127 | A | 5/2000 | Joannopoulos et al. | 372/92 |
| 6,255,150 | B1 | 7/2001 | Wilk et al. | 438/191 |
| 6,274,007 | B1 | 8/2001 | Smirnov et al. | 204/192 |
| 6,281,518 | B1 | 8/2001 | Sato | 257/13 |
| 6,281,532 | B1 | 8/2001 | Doyle et al. | 257/288 |
| 6,326,311 | B1 | 12/2001 | Ueda et al. | 438/694 |
| 6,344,271 | B1 | 2/2002 | Yadav et al. | 428/402 |
| 6,350,993 | B1 | 2/2002 | Chu et al. | 257/19 |
| 6,376,337 | B1 | 4/2002 | Wang et al. | 438/478 |
| 6,436,784 | B1 | 8/2002 | Allam | 438/380 |
| 6,472,685 | B2 | 10/2002 | Takagi | 257/77 |
| 6,498,359 | B2 | 12/2002 | Schmidt et al. | 257/190 |
| 6,501,092 | B1 | 12/2002 | Nikonov et al. | 257/29 |
| 6,521,549 | B1 | 2/2003 | Kamath et al. | 438/786 |
| 6,566,679 | B2 | 5/2003 | Nikonov et al. | 257/29 |
| 6,608,327 | B1 | 8/2003 | Davis et al. | 257/76 |
| 6,621,097 | B2 | 9/2003 | Nikonov et al. | 257/17 |
| 6,638,838 | B1 | 10/2003 | Eisenbeiser et al. | 438/481 |
| 6,646,293 | B2 | 11/2003 | Emrick et al. | 257/194 |
| 6,673,646 | B2 | 1/2004 | Droopad | 438/85 |
| 6,690,699 | B2 | 2/2004 | Capasso et al. | 372/44 |
| 6,711,191 | B1 | 3/2004 | Kozaki et al. | 372/43 |
| 6,748,002 | B2 | 6/2004 | Shveykin | 372/45 |
| 6,816,530 | B2 | 11/2004 | Capasso et al. | 372/50 |
| 7,018,900 | B2 * | 3/2006 | Kreps | 438/285 |
| 7,023,010 | B2 | 4/2006 | Wang et al. | 257/15 |
| 7,202,494 | B2 * | 4/2007 | Blanchard et al. | 257/9 |
| 2002/0094003 | A1 | 7/2002 | Bour et al. | 372/46 |
| 2003/0034529 | A1 | 2/2003 | Fitzgerald et al. | 257/369 |
| 2003/0057416 | A1 | 3/2003 | Currie et al. | 257/19 |
| 2003/0089899 | A1 | 5/2003 | Lieber et al. | 257/9 |
| 2003/0162335 | A1 | 8/2003 | Yuki et al. | 438/151 |
| 2003/0206691 | A1 | 11/2003 | Puzey | 385/24 |
| 2003/0215990 | A1 | 11/2003 | Fitzgerald et al. | 438/172 |
| 2004/0084781 | A1 | 5/2004 | Ahn et al. | 257/777 |
| 2004/0227165 | A1 | 11/2004 | Wang et al. | 257/222 |
| 2005/0272239 | A1 | 12/2005 | Hytha et al. | 438/604 |
| 2006/0292765 | A1 * | 12/2006 | Blanchard et al. | 438/157 |

FOREIGN PATENT DOCUMENTS

| | | |
|---|---|---|
| GB | 2347520 | 9/2000 |
| JP | 61027681 | 2/1986 |
| JP | 61220339 | 9/1986 |
| JP | 62219665 | 9/1987 |
| WO | 99/63580 | 12/1999 |
| WO | 02/103767 | 12/2002 |

OTHER PUBLICATIONS

Tsu, *Phenomena in Silicon Nanostructure Devices*, University of North Carolina at Charlotte, Sep. 6, 2000.

Ye et al., *GaAs MOSFET with Oxide Gate Dielectric Grown by Atomic Layer Deposition*, Agere Systems, Mar. 2003.

Novikov et al., *Silicon-based Optoelectronics*, 1999-2003, pp. 1-6.

Fan et al., *N- and P-Type SiGe/Si Superlattice Coolers*, the Seventeenth Intersociety Conference on Thermomechanical Phenomena in Electronic Systems (ITherm 2000), vol. 1, pp. 304-307, Las Vegas, NV, May 2000.

Shah et al., *Experimental Analysis and Theoretical Model for Anomalously High Ideality Factors (n>2.0) in AlGaN/GaN P-N Junction Diodes*, Journal of Applied Physics, vol. 94, No. 4, Aug. 15, 2003.

Ball, *Striped Nanowires Shrink Electronics*, news@nature.com, Feb. 7, 2002.

Fiory et al., *Light Emission from Silicon: Some Perspectives and Applications*, Journal of Electronic Materials, vol. 32, No. 10, 2003.

*Lecture 6: Light Emitting and Detecting Devices*, MSE 6001, Semiconductor Materials Lectures, Fall 2004.

*Harvard University Professor and Nanosys Co-Founder, Charlie Lieber, Raises the Stakes in the Development of Nanoscale Superlattice Structures and Nanodevices*, Feb. 8, 2002, Nanosys, Inc.

Risch et al., "Vertical MOS Transistors with 70NM Channel Length" IEEE Transactions on Electron Devices, vol. 43, No. 9, Sep. 2006, pp. 1495-1498, XP000636266 IEEE, New York, ISSN: 0018-9383.

Miyano et al., " Numerical Analysis of a Cylindrical Thin Pillar Transistor (CYNTHIA)", IEEE Transactions on Electron Devices, vol. 39, No. 8, Aug. 1992, pp. 1876-1881, XP000294798, IEEE, New York, ISSN: 0018-9383.

* cited by examiner

SEMICONDUCTOR DEVICE WITH A VERTICAL MOSFET INCLUDING A SUPERLATTICE AND RELATED METHODS

RELATED APPLICATION

This application is based upon prior filed provisional application Ser. No. 60/886,375 filed Jan. 24, 2007, the entire subject matter of which is incorporated herein by reference in its entirety.

FIELD OF THE INVENTION

The present invention relates to the field of semiconductors, and, more particularly, to semiconductor devices comprising superlattices and associated methods.

BACKGROUND OF THE INVENTION

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fraction or a binary compound semiconductor layers, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite considerable efforts at materials engineering to increase the mobility of charge carriers in semiconductor devices, there is still a need for greater improvements. Greater mobility may increase device speed and/or reduce device power consumption. With greater mobility, device performance can also be maintained despite the continued shift to smaller devices and new device configurations.

SUMMARY OF THE INVENTION

In view of the foregoing background, it is therefore an object of the present invention to provide a system and related methods for making vertical MOSFET devices having enhanced characteristics such as mobility lift, for example.

This and other objects, features, and advantages are provided by a semiconductor device which may include a substrate and at least one vertical Metal Oxide Semiconductor Field Effect Transistor (MOSFET) on the substrate and including at least one superlattice. The superlattice may include a plurality of laterally stacked groups of layers transverse to the substrate. The vertical MOSFET(s) may further include a gate laterally adjacent the at least one superlattice, and regions vertically above and below the at least one superlattice and cooperating with the gate for causing transport of charge carriers through the at least one superlattice in the vertical direction. More particularly, each group of layers of the superlattice may include a plurality of stacked base semiconductor monolayers defining a base semiconductor portion and at least one non-semiconductor monolayer constrained within a crystal lattice of adjacent base semiconductor portions. Furthermore, at least some atoms from opposing base semiconductor portions may be chemically bound together with the chemical bonds traversing the at least one intervening non-semiconductor monolayer. Because of the enhanced band-engineered properties of the superlattice, the vertical MOSFET(s) may therefore have improved mobility as well as other structural and functional advantages.

More particularly, the at least one superlattice may include a pair of spaced-apart superlattices, and the at least one vertical MOSFET may further include a semiconductor fin between the spaced-apart superlattices. Additionally, the gate may at least partially surround the at least one superlattice, and the gate may include a gate electrode layer and a gate dielectric layer between the gate electrode layer and the at least one superlattice.

By way of example, the substrate may be a semiconductor-on-insulator (SOI) substrate. In addition, the regions may include at least one drain region, above the at least one superlattice; and at least one source region, below the superlattice. More particularly, the at least one source region may include a plurality of laterally spaced-apart source regions.

The semiconductor device may further include a dielectric layer overlying the at least one vertical MOSFET, a respective contact for each of the regions on the dielectric layer, and a respective via extending between each of the contacts and a corresponding region through the dielectric layer. Additionally, the at least one vertical MOSFET may include a plurality thereof. The plurality of MOSFETS may define an inverter, for example. Moreover, at least one n-channel vertical MOSFET and at least one p-channel vertical MOSFET may be included. Also, a respective shallow trench isolation (STI) region may be included between adjacent vertical MOSFETs.

By way of example, the base semiconductor may include silicon, and the at least one non-semiconductor monolayer may include oxygen. In some embodiments, the at least one non-semiconductor monolayer may include a non-semiconductor selected from the group consisting of oxygen, nitrogen, fluorine, and carbon-oxygen.

A related method for making a semiconductor device may include forming at least one vertical MOSFET on a substrate by at least forming at least one superlattice including a plurality of laterally stacked groups of layers transverse to the substrate, forming a gate laterally adjacent the at least one superlattice, and forming regions vertically above and below the at least one superlattice and cooperating with the gate for causing transport of charge carriers through the at least one superlattice in the vertical direction. More particularly, each group of layers of the superlattice may include a plurality of stacked base semiconductor monolayers defining a base semiconductor portion and at least one non-semiconductor monolayer constrained within a crystal lattice of adjacent base semiconductor portions. Furthermore, at least some atoms from opposing base semiconductor portions may be chemically bound together with the chemical bonds traversing the at least one intervening non-semiconductor layer.

DETAILED DESCRIPTION OF THE PREFERRED EMBODIMENTS

Figure 1:
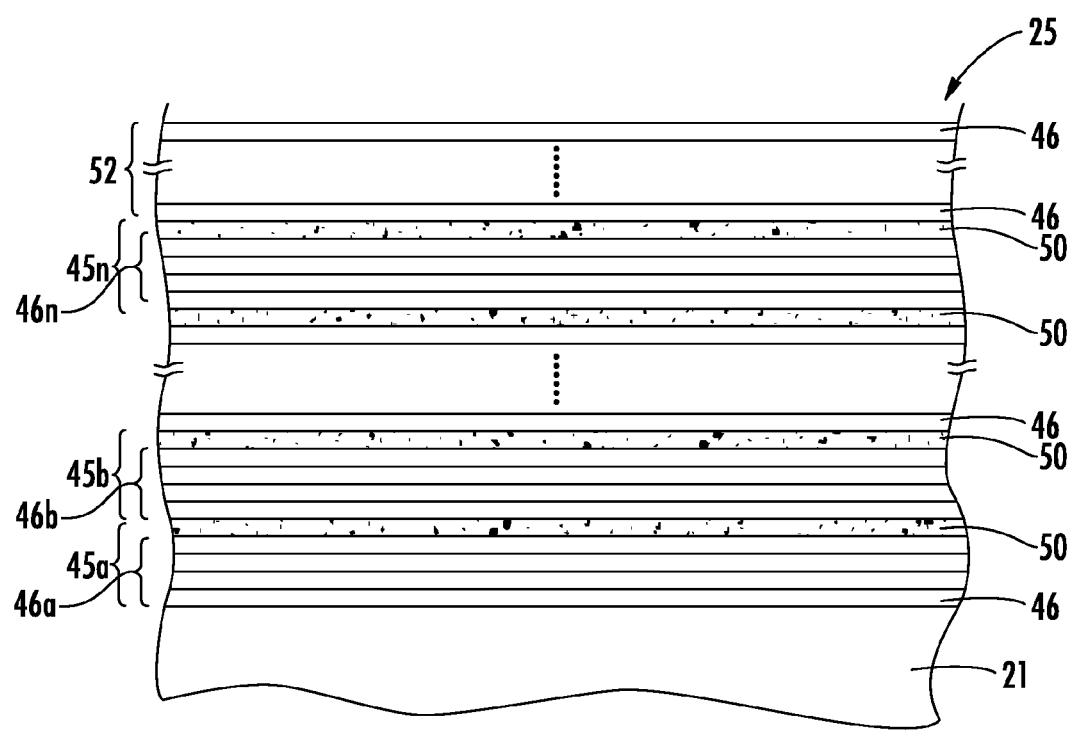
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

The present invention relates to controlling the properties of semiconductor materials at the atomic or molecular level. Further, the invention relates to the identification, creation, and use of improved materials for use in semiconductor devices.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
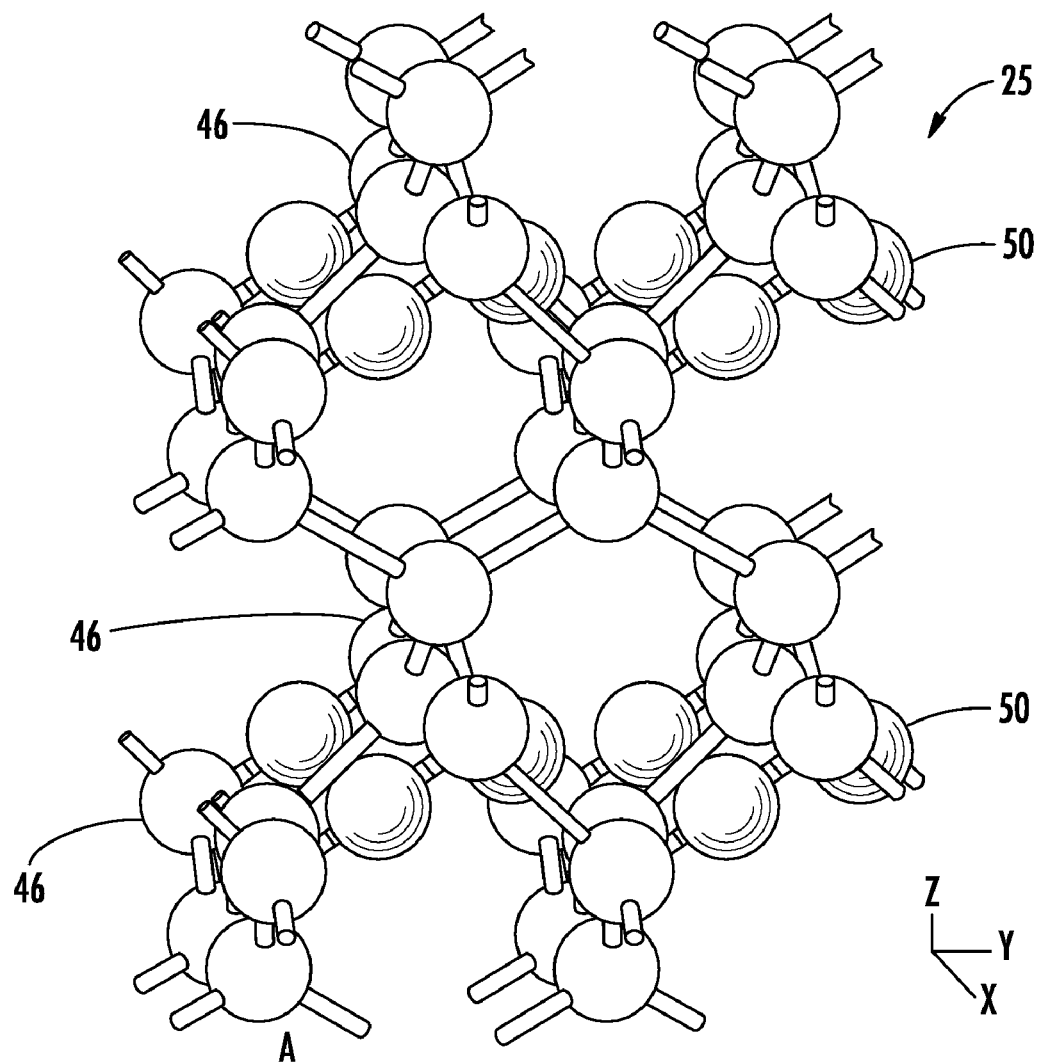
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45*a*-45*n* arranged in stacked relation, as perhaps best understood with specific reference to the schematic cross-sectional view of FIG. 1.

Each group of layers 45*a*-45*n* of the superlattice 25 illustratively includes a plurality of stacked base semiconductor monolayers 46 defining a respective base semiconductor portion 46*a*-46*n* and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46*a*-46*n* are chemically bound together through the non-semiconductor monolayer 50 therebetween, with the chemical bonds traversing the intervening non-semiconductor monolayer(s) therebetween, as seen in FIG. 2. Generally speaking, this configuration is made possible by controlling the amount of non-semiconductor material that is deposited on semiconductor portions 46*a*-46*n* through atomic layer deposition techniques so that not all (i.e., less than full or 100% coverage) of the available semiconductor bonding sites are populated with bonds to non-semiconductor atoms, as will be discussed further below.

Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46*a*-46*n* cause the superlattice 25 to have a lower appropriate conductivity effective mass for the charge carriers in the parallel layer direction than would otherwise be present. Considered another way, this parallel direction is orthogonal to the stacking direction. The band-modifying layers 50 may also cause the superlattice 25 to have a common energy band structure. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material bleed between layers vertically above and below the superlattice 25. These properties may thus advantageously allow the superlattice 25 to provide an interface for high-K dielectrics which not only reduces bleeding of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for optoelectronic devices, for example.

The superlattice 25 also illustratively includes a cap layer 52 on an upper layer group 45*n*. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46*a*-46*n* may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons or holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
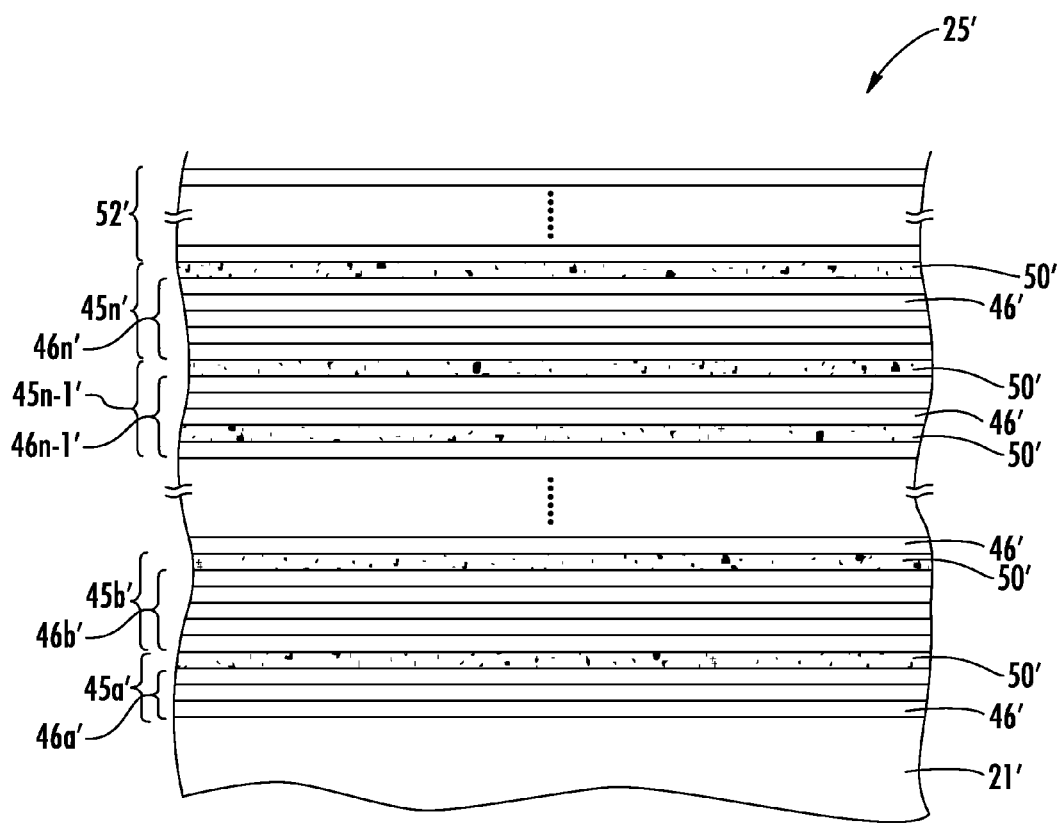
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
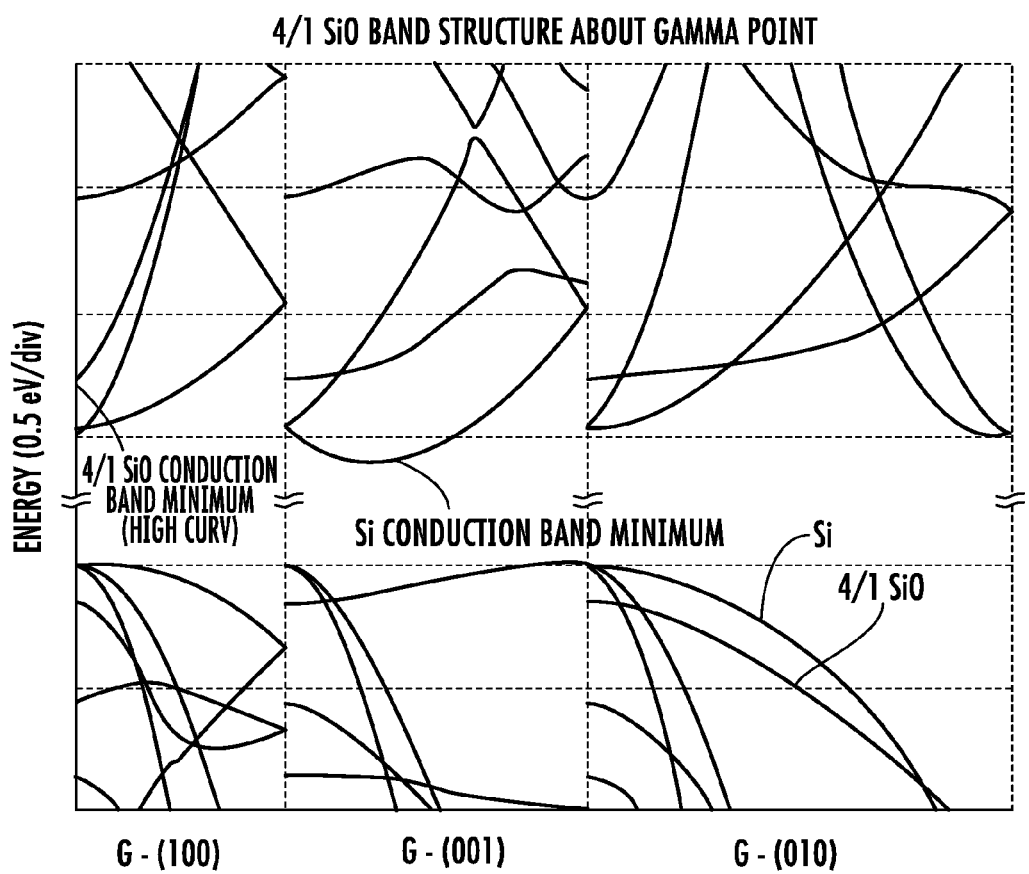
FIG. 4A is a graph of the calculated band structure from the gamma point (G) for both bulk silicon as in the prior art, and for the 4/1 Si/O superlattice as shown in FIGS. 1-2.
Figure 4B:
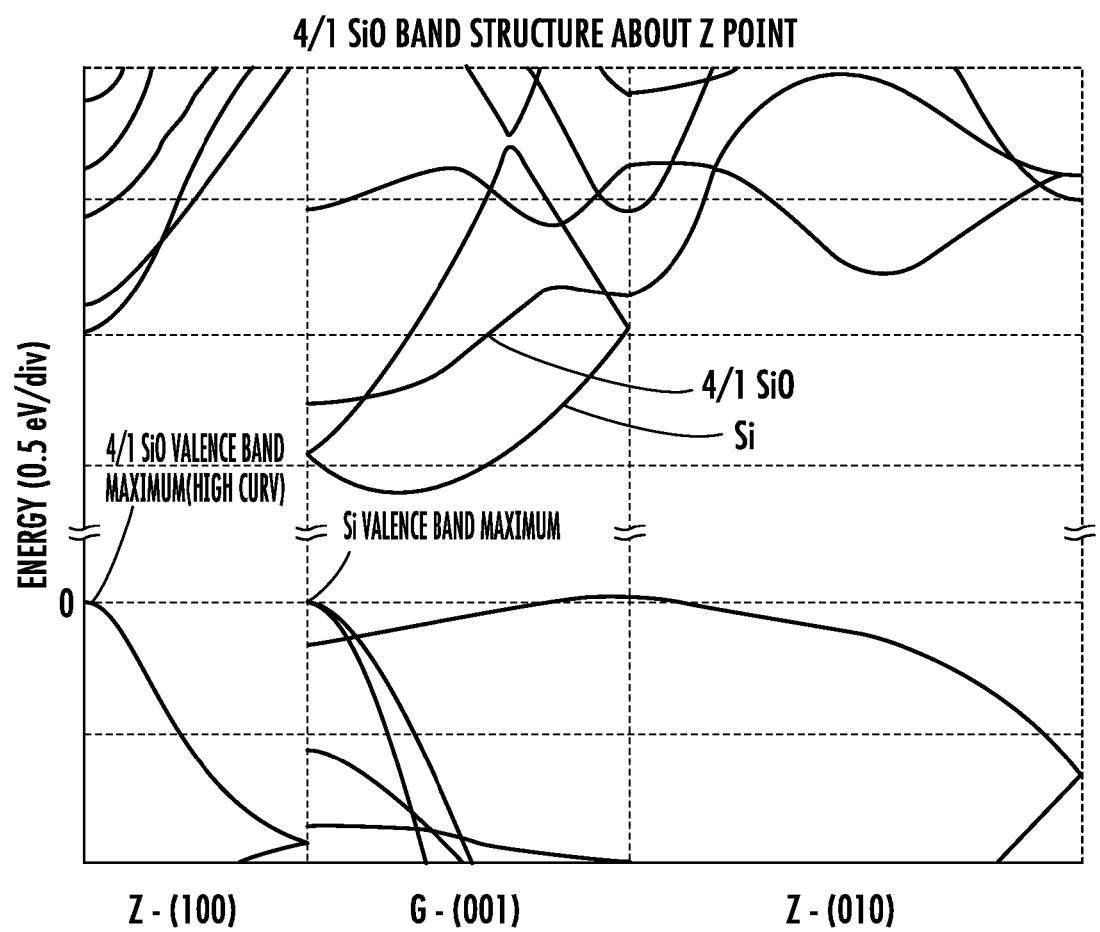
FIG. 4B is a graph of the calculated band structure from the Z point for both bulk silicon as in the prior art, and for the 4/1 Si/O superlattice as shown in FIGS. 1-2.
Figure 4C:
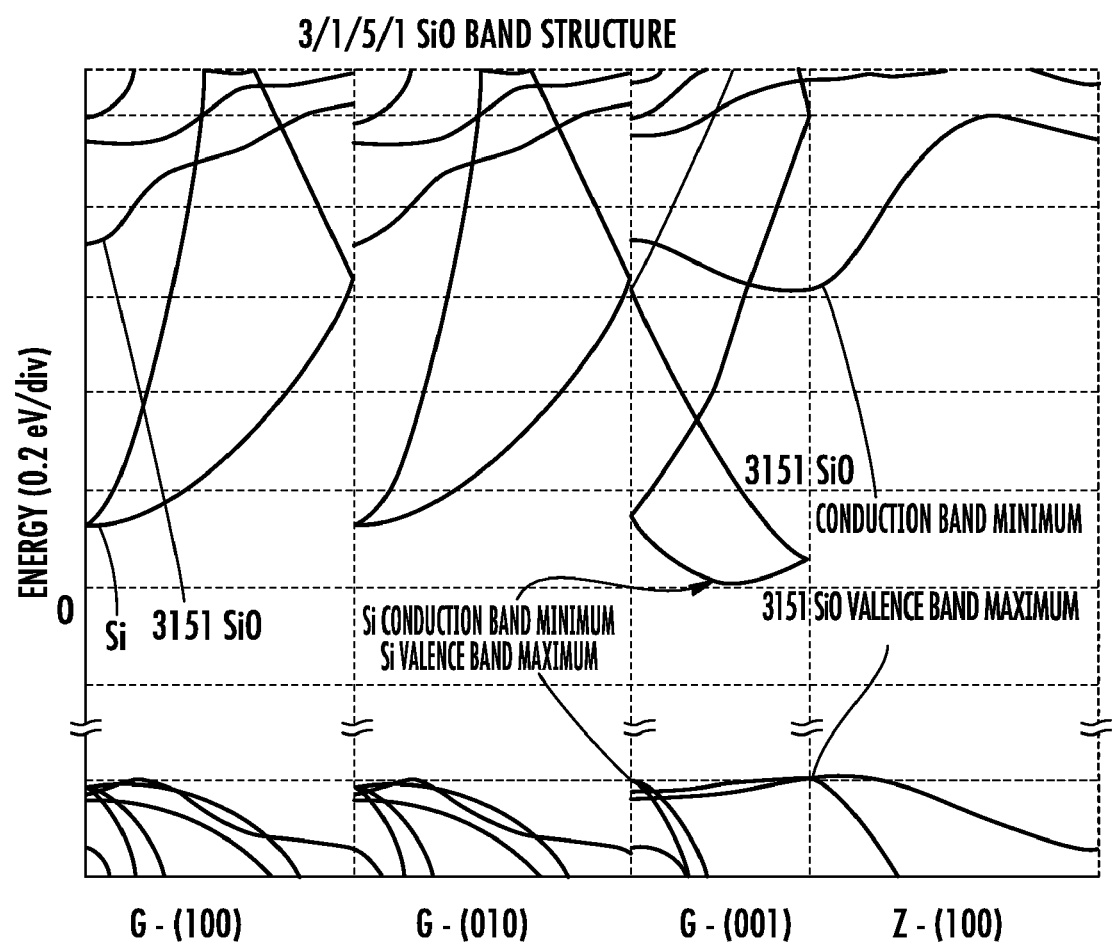
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
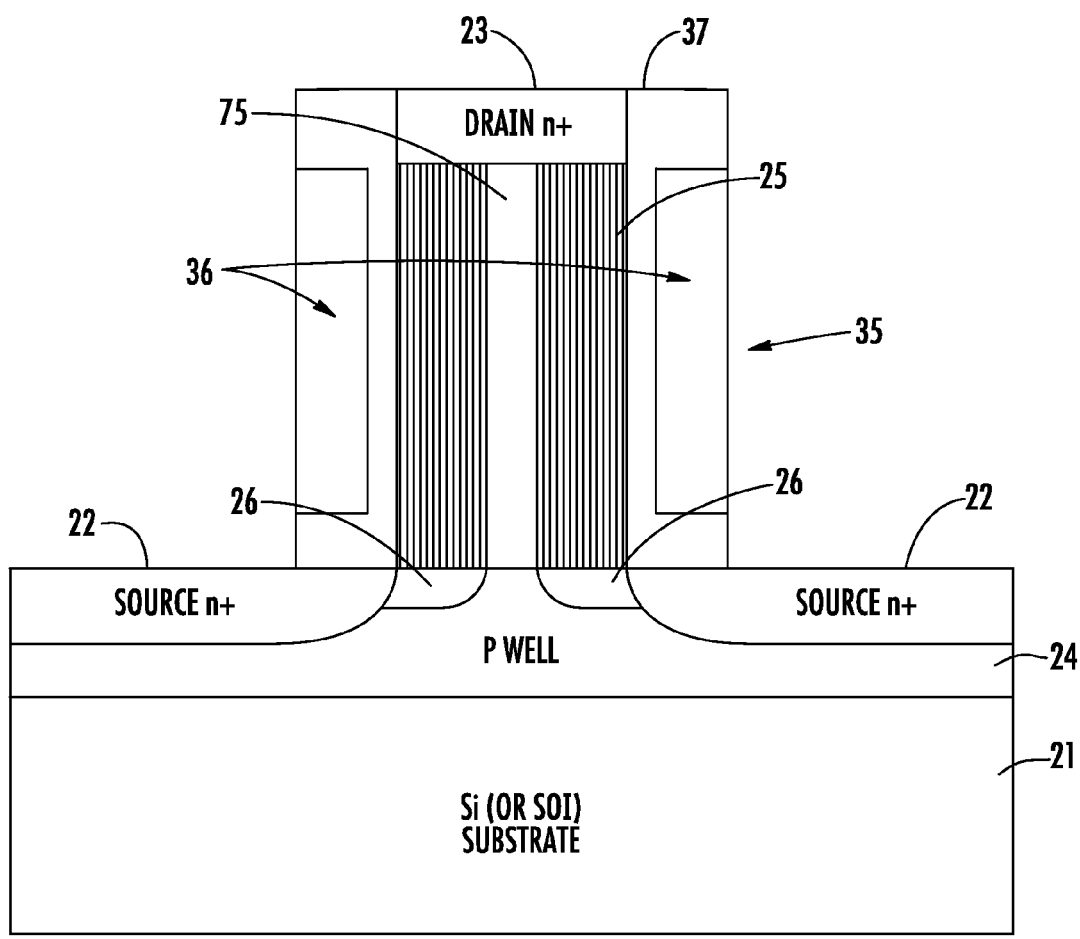
FIG. 5 is a schematic cross-sectional diagram of a vertical MOSFET including a vertical superlattice channel in accordance with the present invention.

Using the above-described measures, one can select materials having improved band structures for specific purposes. One such example would be a vertical MOSFET 20 including a vertical superlattice 25 providing a vertical channel of the MOSFET is now first described with reference to FIG. 5. As used herein, "MOSFET" is meant to include FETs with both metal and non-metal (e.g., semiconductor) gates, as will be appreciated by those skilled in the art. The various layers of the superlattice 25 are stacked in a direction transverse to, or as in the illustrated embodiment, orthogonal to the substrate 21, as opposed to parallel to the substrate. Further details on vertical superlattice structures and methods for forming these structures are provided in co-pending U.S. patent application Ser. No. 11/426,976 and U.S. Pat. No. 7,202,494, both of which are assigned to the present Assignee and are hereby incorporated herein in their entireties by reference.

By way of example, following shallow trench isolation (STI) processing/formation, silicon fins 75 may be formed or etched on the substrate 21. Thereafter, epitaxial deposition of semiconductor monolayers and non-semiconductor monolayers onto the fins 75 is performed to form the vertical superlattice 25. However, other suitable approaches may also be used, as will be appreciated by those skilled in the art. In some embodiments, the vertical superlattice may be cylindrical and surround (or partially surround) the fin 75, and in other embodiments a pair of spaced-apart superlattices may be formed on opposing sides of the fin, for example.

In one embodiment, the substrate 21 is a silicon substrate with an epitaxial silicon layer 24 thereon, although other suitable semiconductor materials (e.g., germanium, etc.) maybe used in other embodiments. Moreover, in some embodiments the epitaxial layer 24 may be omitted, as will be appreciated by those skilled in the art. A source region 22 is formed in the epitaxial layer 24 around the vertical superlattice 25, and a drain region 23 is formed above (i.e., on top of) the superlattice. A source extension region(s) 26 is also formed in the epitaxial layer 24 beneath the vertical superlattice 25. A cylindrical gate 35 illustratively surrounds the vertical superlattice 25 and includes an insulating layer 37 surrounding the superlattice, and a gate electrode layer 36 surrounding the gate insulating layer. In other embodiments, the insulating layer 37 may not be needed because of the above-described structure of the superlattice. It should be noted that the gate 35 need not completely surround the vertical channel 25 in all embodiments.

Figure 6:
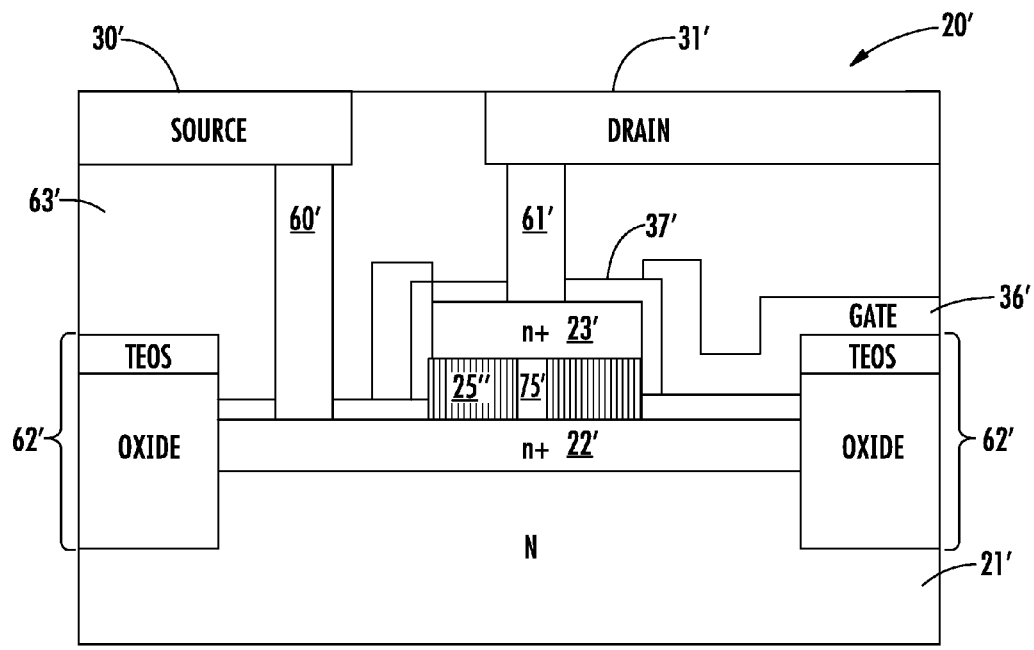
FIG. 6 is a schematic cross-sectional diagram of an alternative embodiment of a vertical MOSFET including a vertical superlattice channel in accordance with the present invention.

Turning now additionally to FIG. 6, an alternative embodiment of a vertical MOSFET 20' illustratively includes source and drain contacts 30', 31' that are connected to the source 22' and drain 23' respectively by vias 60', 61' through a dielectric layer 63'. Moreover, shallow trench isolation (STI) regions 62' including oxide/TEOS are also illustratively included between adjacent transistor cells. It should be noted that while NMOS transistors are illustrated in the above-described examples, PMOS and CMOS configurations are also possible, as will be appreciated by those skilled in the art.

Figure 7:
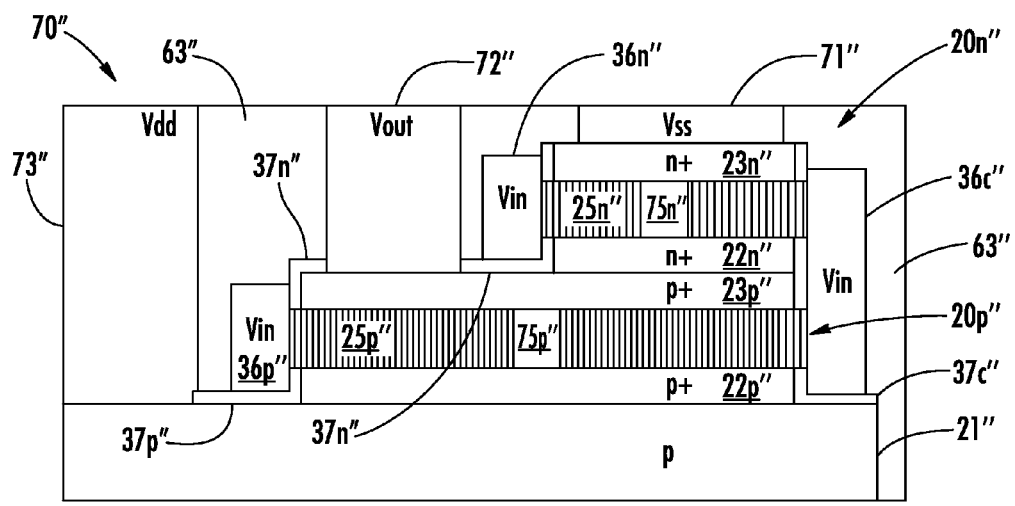
FIG. 7 is a schematic cross-sectional diagram of a vertical inverter including vertical superlattice channels in the MOSFETs thereof in accordance with the present invention.

An exemplary inverter configuration 70" is now described with reference to FIG. 7. The inverter 70" illustratively includes an NMOS transistor 20n" vertically stacked on a PMOS transistor 20p", each of which includes a respective vertical superlattice 25n" and 25p". A common gate electrode 36c" (Vin) is coupled to both vertical superlattices 25p" and 25n" on a right side of the illustrated transistor stack, while respective gate electrodes 36n" and 36p" (Vin) for the NMOS and PMOS transistors 20n", 20p" are coupled to the respective vertical superlattices on the left side thereof in the illustrated embodiment. Moreover, a Vss line 71" is coupled to the NMOS transistor 20n", a Vout line 72" is coupled to the PMOS transistor 20p", and a Vdd line is coupled to the substrate 21", as shown. Here again, it should be noted that other configurations beside the exemplary inverter 70" shown in FIG. 7 may be used in different embodiments (e.g., the NMOS transistor 20n" may be vertically stacked on the PMOS transistor 20p", etc.).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device comprising:
   a substrate; and
   at least one vertical Metal Oxide Semiconductor Field Effect Transistor (MOSFET) on said substrate and comprising
      at least one superlattice comprising a plurality of laterally stacked groups of layers transverse to said substrate,
      a gate laterally adjacent said at least one superlattice, and
      regions vertically above and below said at least one superlattice and cooperating with said gate for causing transport of charge carriers through said at least one superlattice in the vertical direction,
      each group of layers of said superlattice comprising a plurality of stacked base semiconductor monolayers defining a base semiconductor portion and at least one non-semiconductor monolayer constrained within a crystal lattice of adjacent base semiconductor portions, wherein at least some atoms from opposing base semiconductor portions are chemically bound together with the chemical bonds traversing the at least one intervening non-semiconductor monolayer.

2. The semiconductor device of claim 1 wherein said at least one superlattice comprises a pair of spaced-apart superlattices; and further comprising a semiconductor fin between said spaced-apart superlattices.

3. The semiconductor device of claim 1 wherein said gate at least partially surrounds said at least one superlattice.

4. The semiconductor device of claim 1 wherein said gate comprises a gate electrode layer and a gate dielectric layer between said gate electrode layer and said at least one superlattice.

5. The semiconductor device of claim 1 wherein said substrate comprises a semiconductor-on-insulator (SOI) substrate.

6. The semiconductor device of claim 1 wherein said regions comprise at least one drain region and at least one source region.

7. The semiconductor device of claim 6 wherein said at least one source region comprises a plurality of laterally spaced-apart source regions.

8. The semiconductor device of claim 1 wherein said base semiconductor comprises silicon.

9. The semiconductor device of claim 1 wherein said at least one non-semiconductor monolayer comprises oxygen.

10. The semiconductor device of claim 1 wherein said at least one non-semiconductor monolayer comprises a non-semiconductor selected from the group consisting of oxygen, nitrogen, fluorine, and carbon-oxygen.

11. The semiconductor device of claim 1 further comprising:
    a dielectric layer overlying said at least one vertical MOSFET;
    a respective contact for each of said regions on said dielectric layer; and
    a respective via extending between each of said contacts and a corresponding region through said dielectric layer.

12. The semiconductor device of claim 1 wherein said at least one vertical MOSFET comprises a plurality thereof defining an inverter.

13. The semiconductor device of claim 1 wherein said at least one vertical MOSFET comprises at least one n-channel vertical MOSFET and at least one p-channel vertical MOSFET.

14. The semiconductor device of claim 1 wherein said at least one vertical MOSFET comprises a plurality thereof; and further comprising a respective shallow trench isolation (STI) region between adjacent vertical MOSFETs.

15. A semiconductor device comprising:
a substrate; and
at least one vertical Metal Oxide Semiconductor Field Effect Transistor (MOSFET) on said substrate and comprising
a pair of spaced-apart superlattices each comprising a plurality of laterally stacked groups of layers transverse to said substrate, and a semiconductor fin between said superlattices,
a gate at least partially surrounding said at least one superlattice, and
regions vertically above and below said at least one superlattice and cooperating with said gate for causing transport of charge carriers through said at least one superlattice in the vertical direction,
each group of layers of said superlattice comprising a plurality of stacked base semiconductor monolayers defining a base semiconductor portion and at least one non-semiconductor monolayer constrained within a crystal lattice of adjacent base semiconductor portions, wherein at least some atoms from opposing base semiconductor portions are chemically bound together with the chemical bonds traversing the at least one intervening non-semiconductor monolayer.

16. The semiconductor device of claim 15 wherein said regions comprise at least one drain region and at least one source region.

17. The semiconductor device of claim 15 wherein said base semiconductor comprises silicon, and wherein said at least one non-semiconductor monolayer comprises oxygen.

18. The semiconductor device of claim 15 further comprising:
a dielectric layer overlying said at least one vertical MOSFET;
a respective contact for each of said regions on said dielectric layer; and
a respective via extending between each of said contacts and a corresponding region through said dielectric layer.

19. The semiconductor device of claim 15 wherein said at least one vertical MOSFET comprises a plurality thereof defining an inverter.

20. A method for making a semiconductor device comprising:
forming at least one vertical Metal Oxide Semiconductor Field Effect Transistor (MOSFET) on a substrate by at least
forming at least one superlattice comprising a plurality of laterally stacked groups of layers transverse to the substrate,
forming a gate laterally adjacent the at least one superlattice, and
forming regions vertically above and below the at least one superlattice and cooperating with the gate for causing transport of charge carriers through the at least one superlattice in the vertical direction,
each group of layers of the superlattice comprising a plurality of stacked base semiconductor monolayers defining a base semiconductor portion and at least one non-semiconductor monolayer constrained within a crystal lattice of adjacent base semiconductor portions, wherein at least some atoms from opposing base semiconductor portions are chemically bound together with the chemical bonds traversing the at least one intervening non-semiconductor monolayer.

21. The method of claim 20 wherein forming the at least one superlattice further comprises forming a pair of spaced-apart superlattices with a semiconductor fin therebetween.

22. The method of claim 20 wherein forming the gate further comprises forming the gate to at least partially surround the at least one superlattice.

23. The method of claim 20 wherein forming the regions comprises forming at least one drain region and at least one source region.

24. The method of claim 20 wherein the base semiconductor comprises silicon, and wherein the at least one non-semiconductor monolayer comprises oxygen.

25. The method of claim 20 further comprising:
forming a dielectric layer overlying the at least one vertical MOSFET;
forming a respective contact for each of the regions on the dielectric layer; and
forming a respective via extending between each of the contacts and a corresponding region through the dielectric layer.

26. The method of claim 20 wherein forming the at least one vertical MOSFET comprises forming a plurality thereof defining an inverter.

* * * * *